(12) United States Patent
Ohta et al.

(10) Patent No.: US 6,615,389 B1
(45) Date of Patent: Sep. 2, 2003

(54) DATABASE FOR DESIGNING INTEGRATED CIRCUIT DEVICE, AND METHOD FOR DESIGNING INTEGRATED CIRCUIT DEVICE

(75) Inventors: Mitsuyasu Ohta, Osaka (JP); Sadami Takeoka, Osaka (JP); Osamu Ichikawa, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/561,342

(22) Filed: Apr. 28, 2000

(30) Foreign Application Priority Data

Apr. 30, 1999 (JP) .............................. 11-124034

(51) Int. Cl.$^7$ .............................. G06F 17/50
(52) U.S. Cl. ............ 716/1; 716/4; 716/5; 716/6; 716/8; 716/11; 716/19; 707/103; 703/1; 703/14; 700/97; 326/38; 326/39
(58) Field of Search .................. 716/1–21; 703/14, 703/1; 700/97; 707/103; 326/38, 39

(56) References Cited

U.S. PATENT DOCUMENTS

| | | | | |
|---|---|---|---|---|
| 5,418,728 A | * | 5/1995 | Yada ........................... | 700/97 |
| 5,487,018 A | * | 1/1996 | Loos et al. ................... | 716/11 |
| 5,539,652 A | * | 7/1996 | Tegethoff .................... | 703/14 |
| 5,610,833 A | * | 3/1997 | Chang et al. ................ | 716/11 |
| 5,625,816 A | * | 4/1997 | Burdick et al. ............. | 707/103 |

OTHER PUBLICATIONS

"Scalable Architecture for Testing Embedded Cores", S. Adham et al., (VTS '99) Preliminary Outline of the IEEE P1500.

* cited by examiner

*Primary Examiner*—Vuthe Siek
*Assistant Examiner*—Helen B Rossoshek
(74) *Attorney, Agent, or Firm*—McDermott, Will & Emery (57) ABSTRACT

In response to a design request, fault detection strategy optimizing means selects RT-VCs and a fault detection method from a VCDB. The design request includes: requirements for a system LSI (e.g., area, number of pins, test time and information about the weights of prioritized constraints); and VC information. The fault detection strategy optimizing means performs computations for optimization in view of various parameters, thereby specifying a best fault detection strategy and a method of constructing a single-chip fault detection controller. On the VCDB, multiple VCs associated with the same function and mutually different test techniques are stored. By weighting the parameters affecting a test cost in accordance with a user defined priority order, a test technique of the type minimizing the total test cost can be selected from the VCDB.

16 Claims, 11 Drawing Sheets

Fig. 9b many pins needed ⇕ long pattern needed

DATABASE FOR DESIGNING INTEGRATED CIRCUIT DEVICE, AND METHOD FOR DESIGNING INTEGRATED CIRCUIT DEVICE

BACKGROUND OF THE INVENTION

The present invention generally relates to a database for use in the design of an integrated circuit device and to a design method using such a database. More particularly, the present invention relates to techniques of optimizing a test strategy taken to detect faults, for example, in the integrated circuit device.

A semiconductor device for an electronic unit has been fabricated until just recently by forming individual types of LSIs such as memories and processors on respective semiconductor chips and then mounting and interconnecting all of these chips together on a motherboard like a printed wiring board.

Over the past few years, however, a semiconductor device is increasingly required to reduce its overall size, power dissipation and fabrication cost to further broaden the industrial applicability of an electronic unit including the device. Among other things, a consumer electronic appliance for use in digital information processing has to meet all of these requirements more perfectly than any other electronic unit. Responsive to such a demand from the electronics industry, the prime target of semiconductor technology is now shifting from memories to system LSIs.

Specifically, a system LSI is a single-chip implementation including memories and various types of logic circuits that are integrated together on a single chip. To realize a system-on-chip, not only the process technology of forming devices, like transistors, with dissimilar structures on a common substrate, but also the design technology thereof should be greatly innovated.

Thus, according to a suggested technique of designing a system-on-chip, a database is prepared in advance to design an arbitrary block consisting of a great number of cells, which together implement a required function, e.g., a so-called "functional block". By using such a database, any desired system LSI can be designed as a combination of these blocks. In such a case, a specific physical structure for executing an intended function has been defined in advance for each functional block. Thus, in the physical design of an overall semiconductor device, only the interconnections among these functional blocks and peripheral circuitry have to be newly laid out. In this manner, the conventional method tries to increase the design efficiency considerably.

In the conventional design process, however, a core has been selected in compliance with various requirements and specifications that should be met to realize a desired function, and has been designed simply by following a test procedure specified for the core. That is to say, an overall integrated circuit is designed as a collection of those cores in accordance with such an overly simplified procedure. In other words, when such a technique is adopted, a test cost is automatically determined as a result of the design process and it has been difficult to reduce the test cost while maintaining desirable test quality. Also, a core has not been selected and designed in such a manner as to minimize the cost of testing an overall semiconductor integrated circuit device.

SUMMARY OF THE INVENTION

An object of the present invention is reducing the cost of carrying out a test, like fault detection diagnosis, on an integrated circuit device that is being designed using a database, in which data about various components is stored as a collection of virtual cores in a flexibly usable state.

A first inventive database for designing an integrated circuit device includes multiple cores for storing thereon data needed in designing the device. In the first database, the cores are associated with the same function and mutually different test techniques.

A core associated with a test technique that would be advantageous in terms of a particular parameter can be selected from the inventive database. Thus, a strategy for a test, like fault detection diagnosis, for example, can be optimized in an integrated circuit device.

A second inventive database for designing an integrated circuit device also includes multiple cores for storing thereon data needed in designing the device. In the second database, at least one test technique is stored for each said core.

If such a database is used, a test cost required for each core can be estimated in association with a particular parameter. Thus, it is possible to select an optimum test strategy for detecting faults, for example, in an integrated circuit device.

In one embodiment of the present invention, information about a test cost, which is required by the at least one test technique for each said core, is stored.

In such an embodiment, a test technique that would be advantageous in terms of a test cost can be selected from the inventive database. Thus, the strategy for a test, like fault detection diagnosis, on an integrated circuit device can be optimized about the test cost.

In this particular embodiment, the information about the test cost is at least one item selected from the group consisting of: how many pins should be controlled and monitored externally when the core is tested; how long a test pattern is; how much the integrated circuit device increases its area when a test circuit is added; fault coverage; test time; number of design process steps; and yield of the device.

A third inventive database for designing an integrated circuit device includes at least one core for storing thereon data needed in designing the device. In the inventive database, information about a test constraint is stored for a technique of testing the at least one core.

By using such a database, an optimum test technique for detecting faults in an integrated circuit device, for example, can be selected so as to meet a test constraint.

In one embodiment of the present invention, the information about the test constraint is at least one item selected from the group consisting of: in what state a pin should be to control the core in a test mode or to keep the core safe and non-broken; whether the core should be dynamic or static; whether or not a test pattern may be divided; and where the test pattern should be divided.

A first inventive method for designing an integrated circuit device uses a core database. The core database includes multiple cores for storing thereon data needed in designing the device. A plurality of test techniques are stored for the respective cores. The method includes the steps of: a) picking candidate cores and associated test techniques for use in testing the device from the database; b) estimating a total test cost for each said core and associated test technique picked; and c) selecting one of the candidate cores and associated one of the test techniques that will minimize the test cost.

According to the first method, an integrated circuit device can be tested under such conditions as minimizing the test cost. Thus, an optimum strategy can be selected for detecting faults in the device, for example.

In one embodiment of the present invention, the estimated test costs are presented in the step b). A process for minimizing the test cost can be performed rapidly by doing so.

In another embodiment of the present invention, it is determined in the step b) whether or not each said test technique picked meets a constraint on the number of pins available for testing, and the test costs are estimated for only the test techniques meeting the constraint. In this manner, inappropriate test techniques are not picked.

In this particular embodiment, if one of the test techniques picked fails to comply with the constraint, an error is preferably indicated in the step b).

In still another embodiment, a test pattern for each said core picked is divided in the step b) with respect to time so as to meet a constraint on the number of pins available for testing, the test pattern is modified to minimize a test time and then the test cost is estimated. In this manner, a cost associated with a test time can be estimated more accurately.

In yet another embodiment, the test cost is estimated in the step b) by weighting priority orders in terms of a parameter affecting the test cost.

A second inventive method for designing an integrated circuit device also uses a core database. The core database includes multiple cores for storing thereon data needed in designing the device. The cores are associated with the same function and mutually different test techniques. The method includes the steps of: a) picking a candidate core and associated test technique for use in testing the device from the database; b) estimating how much a test cost for the core and test technique picked would be when a constraint is met; c) replacing the core picked with another core that is associated with the same function as, and a different test technique from, the candidate core; and d) selecting one of the cores and an associated test technique thereof as those minimizing the test cost by repeatedly performing the step c).

According to this method, the test cost can be minimized by selecting an appropriate core.

In one embodiment of the present invention, the core and the associated test technique thereof are selected so as to minimize a test time while meeting a constraint on available pins when the test technique is represented as a test pattern in a coordinate system in which pins used are indexed by numbers with respect to time.

DESCRIPTION OF THE PREFERRED EMBODIMENTS

Hereinafter, preferred embodiments of the present invention will be described in terms of core-related concepts of VC, VCDS and VCDB, schematic construction of the VCDS and details of respective sections.

Definitions OF VC, VCDS and VCDB

First, virtual core and virtual core design system according to the present invention will be defined.

The "virtual core (VC)" according to the present invention is a concept definitely different from the "virtual component (also abbreviated as VC)", which is often regarded as synonymous with the "intellectual property (IP)" or "functional block". Unlike the virtual component, the virtual core is defined to design a system LSI as a single integral block. Also, the virtual core stands for a collection of data including recyclable hardware and software. The "virtual core design system (VCDS)" according to the present invention refers to an overall system adapted to optimize the hardware and software indispensable for a desired system LSI by using the VC. The "virtual core database (VCDB)" means a database for use in the VC-based design.

It is noted that the present invention is applicable not just to the virtual core but also to any core definable by IP or any other similar concept.

Schematic Construction of VCDS

Figure 1:
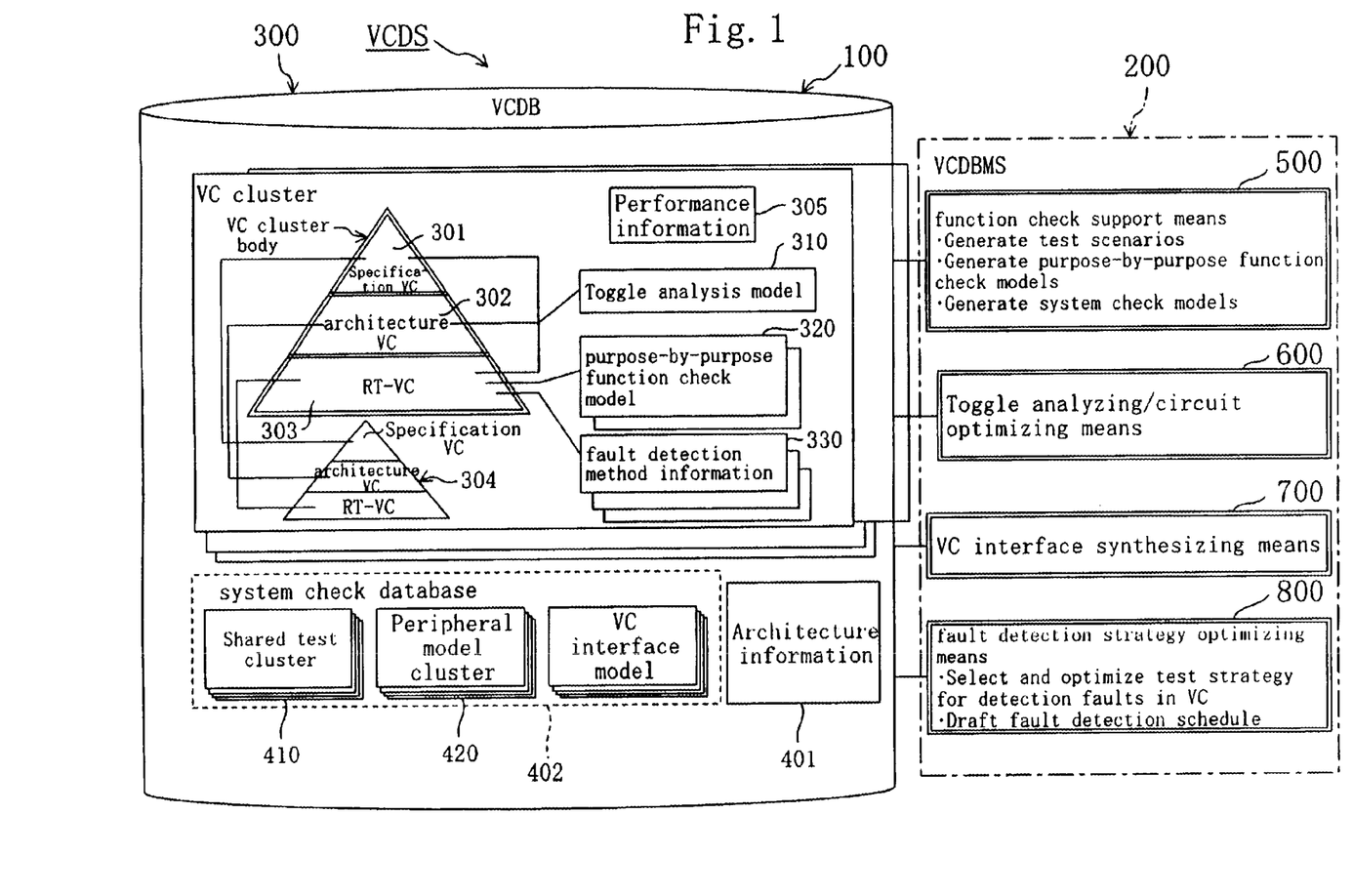
FIG. 1 illustrates a schematic construction of a virtual core design system (VCDS) used for designing a system LSI according to the present invention.

FIG. 1 illustrates a schematic construction of the VCDS used for designing a system LSI according to the present invention.

As shown in FIG. 1, the VCDS according to the present invention is made up of: a VCDB 100, which is implementable as hierarchical data storage for storing thereon data needed in designing a system; and a virtual core database management system (VCDBMS) 200, which is a control system for optimizing the VCDB 100.

The VCDB 100 includes: a VC cluster 300, which is a collection of virtual cores; architecture information 401, which is used to determine the VC architecture of the VC cluster 300; and a system check database 402.

The VC cluster 300 includes a body consisting of: a specification layer (or specification VC) 301, which is a virtual core for storing thereon data described as specifications; an architecture layer (or architecture VC) 302 for storing thereon data described as architectures; and a function layer (or register-transfer VC (RT-VC) 303), which is a virtual core for storing thereon data described at the RT level. The VC cluster 300 further includes: a test cluster 304, in which parameterized test patterns are stored and which is used for performing simulations on a circuit; and performance information 305 used for evaluating the performance of each VC based on the results of the simulations.

The performance information 305 includes performance indices, which are parameters such as area and speed. At the RT level, for example, a certain value can be derived rather accurately. Also, if a system LSI has ever been implemented at the RT level by means of hardware, then the results of the realization may also be incorporated into the performance indices.

The VC cluster 300 further includes toggle analysis model 310, purpose-by-purpose function check model 320 and fault detection method information 330, each of which is linked to one or more VCs in the body of the VC cluster 300. The toggle analysis model 310 is linked to the specification, architecture and RT-VCs 301, 302 and 303 to know how many times a system on target has ever changed its state. The purpose-by-purpose function check model 320 is linked to the RT-VC 303. The fault detection method information 330 is linked to the RT-VC 303 and represents the type of a test that may be carried out on the VC, e.g., scan or BIST test.

The architecture information 401 includes information indicating how to use the respective VCs in practice. For example, when a task should be implemented by means of software, the architecture information 401 tells us which processor and bus (or interface) should be used to execute the task, how power and clock pulses should be supplied, which type of test should be carried out for logic synthesis and what types of constraints will be imposed in naming (i.e., what types of tools should be used to avoid duplications). That is to say, the architecture information 401 contains various types of information necessary for the system LSI on target.

The system check database 402 is used as a database for checking the functions of an LSI that is being formed as a combination of VCs. The system check database 402 includes sharable test cluster 410, peripheral model cluster 420 and VC interface model.

Each of the sharable test cluster 410 and the test cluster 304 in the VC cluster 300 includes test benches, test scenarios, tasks and models. A test bench is made up of test system architecture and functional models. A test scenario describes the flow of checking process steps at a system level, i.e., sequence of system toggles. A task herein means a task for initializing a VC or having a particular function executed. A model herein means a link to a simulation model, VC model or peripheral simulation model used in the architecture defined for the test bench. A specific exemplary construction of the test cluster will be described later.

The peripheral model cluster 420 is a cluster including VC peripheral models used in checking a system, e.g., models describing external media, external memories, transmission lines for a telecommunications LSI and sensors. By using peripheral models such as these in combination with the VCs, the overall system can be checked smoothly. The VC interface model is used as an interface model for performing system simulations by linking respective VCs together.

The VCDBMS 200 is used for registering new VCs at the VCDB 100, searching the VCDB 100 from the outside, generating instances and performing various processes to be described later. The registering process includes not only registering a brand new core, but also generating a new VC by consulting existent VCs and modifying the functions of the VCs, registering additional data items at the VCs, and storing differential management information thereon. The "search" herein means searching a VC at a particular level for a specific type of information.

The VCDBMS 200 includes function check support means 500, toggle analyzing/circuit optimizing means 600, VC interface synthesizing means 700 and fault detection strategy optimizing means 800. The function check support means 500 generates test scenarios, purpose-by-purpose function check models (i.e., simulation models) and system check models (i.e., system simulation models). The fault detection strategy optimizing means 800 selects and optimizes a test method for detecting faults in a VC and drafts a fault detection schedule.

Figure 2:
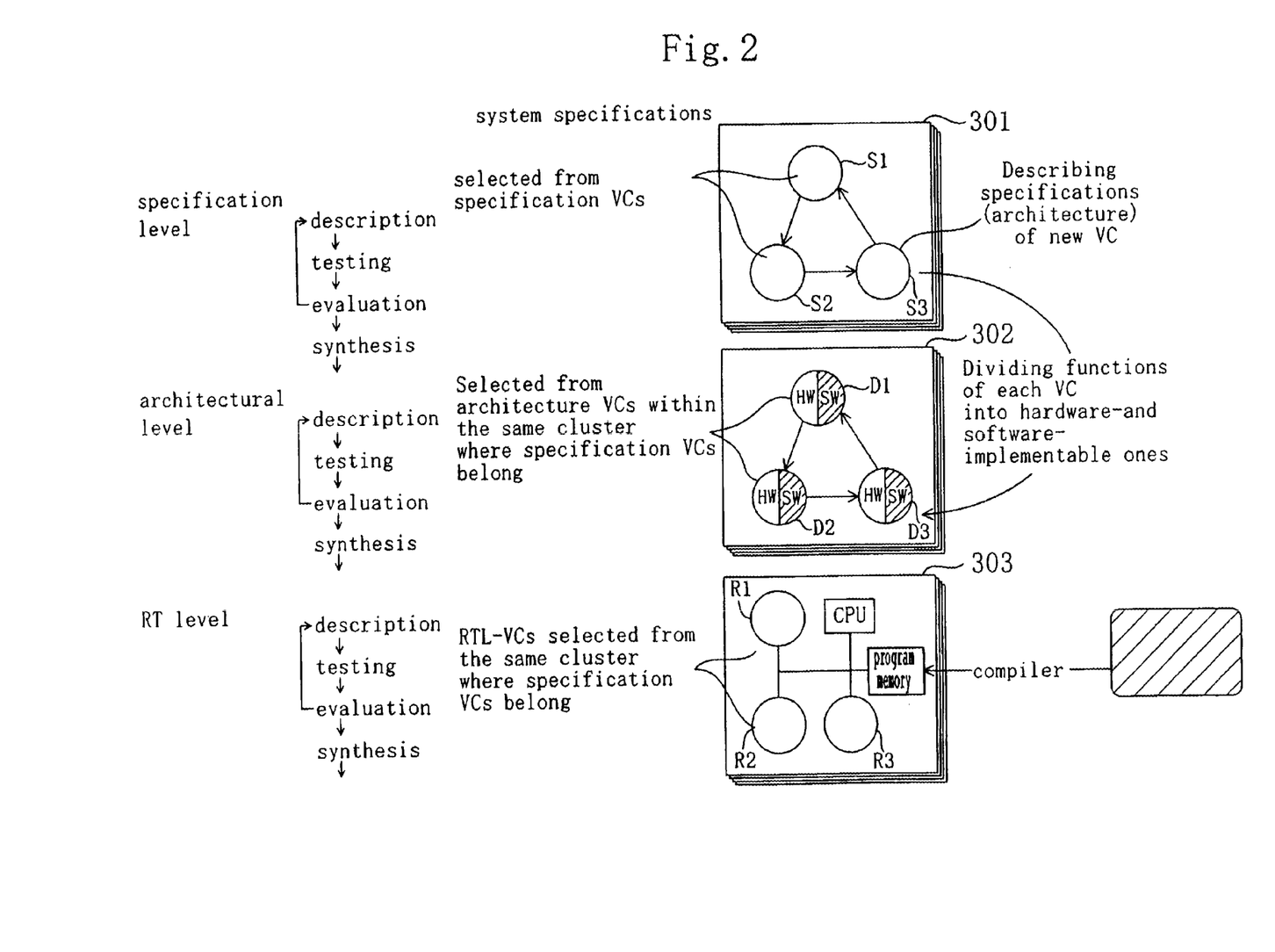
FIG. 2 illustrates a basic flow of tasks in the VCDS according to the present invention.

FIG. 2 illustrates a basic flow of the design process in the VCDS according to the present invention. As shown in FIG. 2, VCs are generated or modified following the processing steps of description, testing, evaluation and synthesis at each of the specification, architectural and RT levels. For example, at the specification level, specification VCs S1 and S2 may be chosen and a new VC S3 may be generated. In this case, the data flows in the direction as indicated by the arrows in FIG. 2, thereby describing, testing and evaluating the data. Then, the evaluative results are fed back. At the architectural level, architecture VCs D1, D2 and D3, corresponding to the specification VCs S1, S2 and S3, respectively, are generated. On this level, each of these VCs is divided into two sections, which are associated with hardware and software implementations, respectively, considering the intended functions thereof. At the RT level, not only RT-VCs R1, R2 and R3, corresponding to the architecture VCs D1, D2 and D3, respectively, but also bus, CPU, memory and so on, interconnecting these VCs, are generated. That is to say, a more specific implementation is defined at the RT level.

Each of these tasks may be described as a state transition from a specification VC through external input/output sections. The specification VC is described in a language or figure representing state transition, logic and truth table.

By placing VCs at respective levels and managing these VCs collectively in this manner, a flexibly usable database, which is definitely different from a conventional functional block, can be provided.

Figure 3:
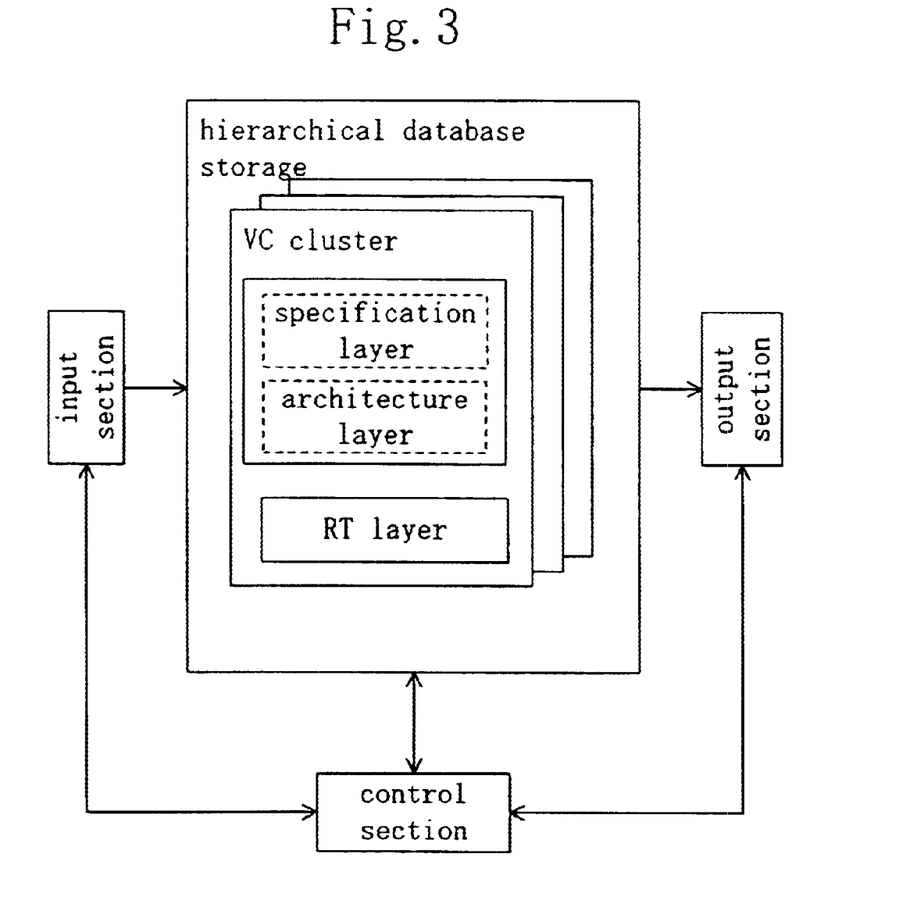
FIG. 3 is a block diagram illustrating the functional portions extracted from the system shown in FIG. 1.

FIG. 3 is a block diagram illustrating the functional portions extracted from the system shown in FIG. 1. As shown in FIG. 3, an input section is provided for inputting information to the hierarchical database storage, on which the VC clusters are stored. An output section is further provided for receiving the information output from the hierarchical database storage. And a control section controls the hierarchical database storage and input and output sections. In each of these VC clusters, there are functions represented by the specification, architecture and RT layers for generating specification, architecture and RT-VCs, respectively. Since the specification and architecture layers cannot always be distinguished clearly from each other, a combined specification/architecture layer is illustrated in FIG. 3. The "architecture" herein defines the allocation of software and hardware with respect to a single set of specifications. Generally speaking, various types of architecture are definable for a single set of specifications. Also, the "register transfer" herein defines hardware-implementable architecture. In general, several different types of implementations are imaginable for a single sort of architecture, because the architecture is implementable with mutually different sets of parameters respected. That is to say, as will be detailed later, the VC cluster usually has a hierarchical structure, in which each specification VC is associated with a plurality of architecture VCs and each of these architecture VCs is further associated with a plurality of RT-VCs. It should be noted, however, that both the "specification" and "architecture" could be regarded as representing functional concepts. Accordingly, it is sometimes difficult to distinguish these two concepts clearly. In that case, the specification VC and architecture VC may be combined into a specification/architecture VC for a database.

Also, in optimizing the fault detection strategy in the following manner, the VC does not have to be hierarchized. Furthermore, the inventive core is applicable to an IP core, which is a different concept from VC.

Method for Optimizing Fault Detection Strategy

Figure 4:
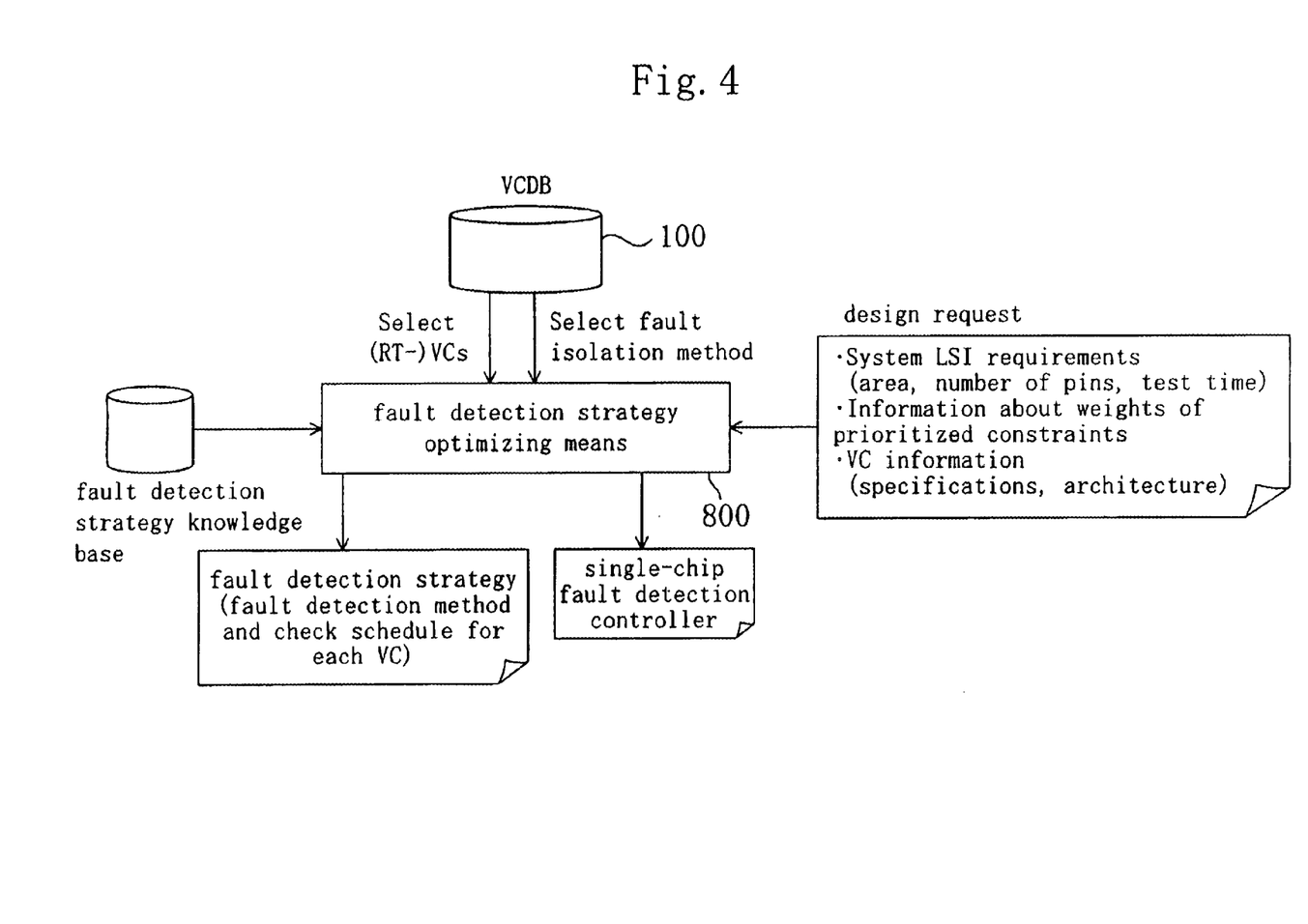
FIG. 4 is a block diagram illustrating an inventive method for optimizing a fault detection strategy.

FIG. 4 is a block diagram illustrating a method for optimizing a fault detection strategy. As shown in FIG. 4, in response to a design request, the fault detection strategy optimizing means 800 selects RT-VCs and a fault detection method from the VCDB 100. The design request includes: requirements for a system LSI (e.g., area, number of pins, test time and information about the weights of prioritized constraints); and VC information. By consulting a fault detection strategy knowledge base including, for example, a description that a VC with a poor yield should be tested earlier than the other VCs, the fault detection strategy optimizing means 800 performs computations for optimization in view of various parameters. In this manner, the fault detection strategy optimizing means 800 specifies a test method best suited to each VC and a method of constructing a single-chip fault detection controller and chooses a test bench for testing respective VCs and the entire chip.

Figure 11:
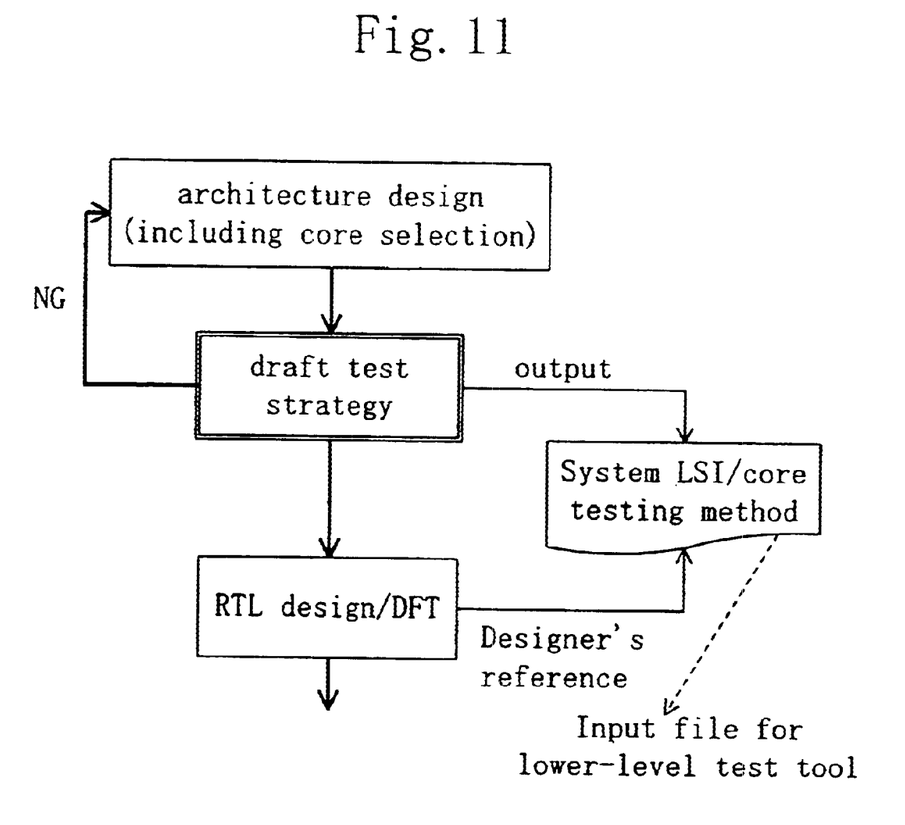
FIG. 11 is a flowchart illustrating where a test strategy is positioned in the design of a system LSI.

FIG. 11 is a flowchart illustrating where draft of fault detection strategy is positioned in the design process of a system LSI. After an architecture design, including core (VC) selection, has been carried out first, the fault detection strategy is worked out and then the fault detection strategy drafted is output as a method for testing a system LSI or cores (or VCs). Thereafter, when RTL design and DFT are performed, the designer can make reference to this test method. Alternatively, the test method, which has been determined as a result of the fault detection strategy drafting, may be an input file for a lower-level test tool.

In this case, the VC includes information needed in designing functions and architecture (e.g., performance specifications and circuit description at the RTL) and information about the test design. In the design at the architectural level, cores (VCs) are selected in accordance with not only the information about the performance specifications implementing the functions and architecture but also results of the inventive process for realizing an optimum test design costs. Thereafter, the design process will be carried out in accordance with the results of the process and information about the design of RTL descriptions stored in the VCDB.

In the illustrated embodiment, multiple VC clusters associated with the same function and mutually different test techniques are stored on the VCDB 100. These test techniques may be stored on the test cluster 304 in the VC cluster 300 shown in FIG. 1 and may sometimes be called the "test scenarios". Also, in this embodiment, a plurality of test techniques, realizing the same function using mutually different test patterns, are stored on the VCDB 100 for each of the VC clusters. Information about a test cost required by at least one test technique is also stored on the VCDB 100 for each VC. For example, such information includes how many pins should be controlled and monitored externally when the core is tested, how long the test pattern will be, how much the integrated circuit device increases its area when a test circuit is added, fault coverage, test time, number of design process steps and yield of the integrated circuit device. Information about test constraints is also stored on the VCDB 100. For instance, such information includes: in what state a pin should be to control the core in a test mode or to keep the core safe and non-broken; whether the core may be dynamic or static; whether or not a test pattern may be divided; and where the test pattern should be divided.

The "test technique" herein includes: a method for constructing a test circuit that carries out the test; a method for evaluating results of scan, BIST, isolation, IDDQ and delay tests; and specific test patterns used for implementing these methods. Also, an actual test is performed after a test pattern has been modified in accordance with the adopted methods for constructing the circuit and evaluating the test results.

Next, measures taken to minimize a test cost will be described.

For example, suppose a test cost is evaluated using the three parameters of area, test time and number of design process steps. In such a case, a total test cost Ctotl is represented as a sum of an area cost Csize, a test time cost Ctime and a design process step number cost Cproc:

$$Ctotl = Csize + Ctime + Cproc$$

However, since there are various constraints and trade-off relationships, the area, test time and design process step number costs should be weighted with coefficients $\alpha$, $\beta$ and $\gamma$, respectively, depending on how important these parameters will be to the user. In this manner, the test cost can be evaluated while taking the constraints into account.

Accordingly, an evaluative function for minimizing the test cost is given by the following equation:

$$Ctotl = \alpha \cdot Csize + \beta \cdot Ctime + \gamma \cdot Cproc$$

A test technique for minimizing the test cost can be selected in accordance with this equation. It should be noted that the evaluative function could be defined using any other parameters in addition to the three.

Hereinafter, detailed contents of the process to be performed to minimize the test cost will be described by way of specific examples.

SPECIFIC EXAMPLE 1

First, a first specific example, relating to reduction in test cost by dividing a test pattern, will be described.

Figure 5A:
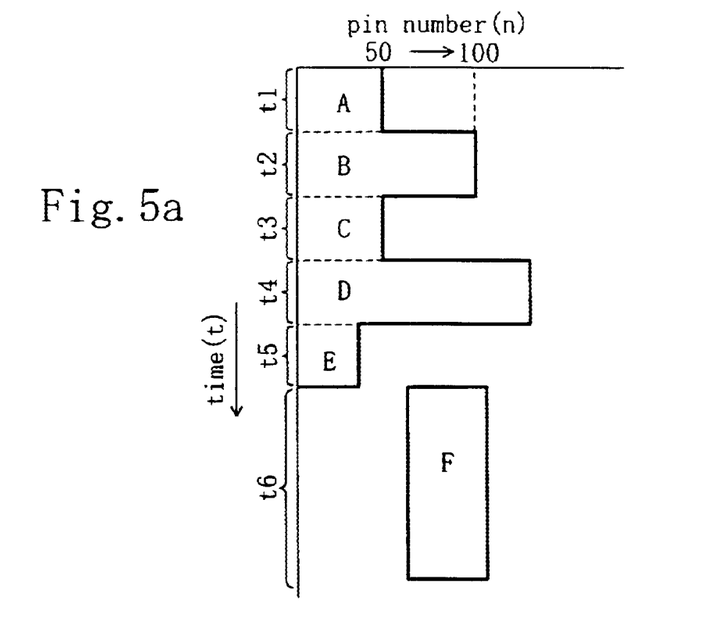
FIGS. 5(a) and 5(b) illustrate two exemplary test patterns before and after the fault detection strategy is optimized by dividing a test pattern.
Figure 5B:
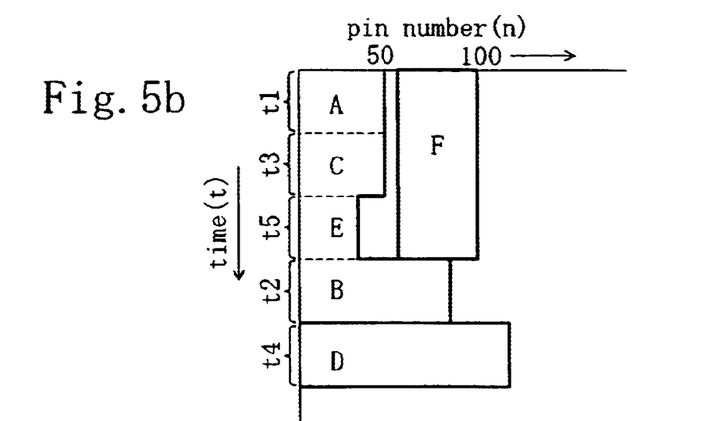

FIGS. 5(a) and 5(b) illustrate two exemplary test patterns before and after the fault detection strategy is optimized by dividing a test pattern. In FIGS. 5(a) and 5(b), the axis of ordinates represents the time t taken to perform the test, while the axis of abscissas represents the numbers n of pins of a circuit under the test. In general, a program for testing a lot of items is incorporated into a single test pattern. As shown in FIG. 5(a), a test is carried out in a time t1 by using pins No. 1 through No. 50 for a part A of the test pattern. As for another part B of the test pattern, a test is carried out in a time t2 by using pins No. 1 through No. 100. And the remaining parts C, D, E and F of the test pattern are tested in times t3, t4, t5 and t6, respectively. That is to say, the total test time needed for the test pattern is t1+t2+t3+t4+t5+t6.

However, a test and another test should be executable in parallel unless a common pin is used.

Thus, as shown in FIG. 5(a), the test time needed for the entire test pattern can be reduced to t1+t2+t3+t4+t5 by changing the order of respective parts A, B, C, D, E and F of the test pattern. That is to say, the total time can be cut down by t6.

By dividing a test pattern on the time axis if it is dividable and changing the order of respective parts of the pattern such that the same pin is not used at the same time, the cost concerning the test time can be minimized.

SPECIFIC EXAMPLE 2

Figure 6:
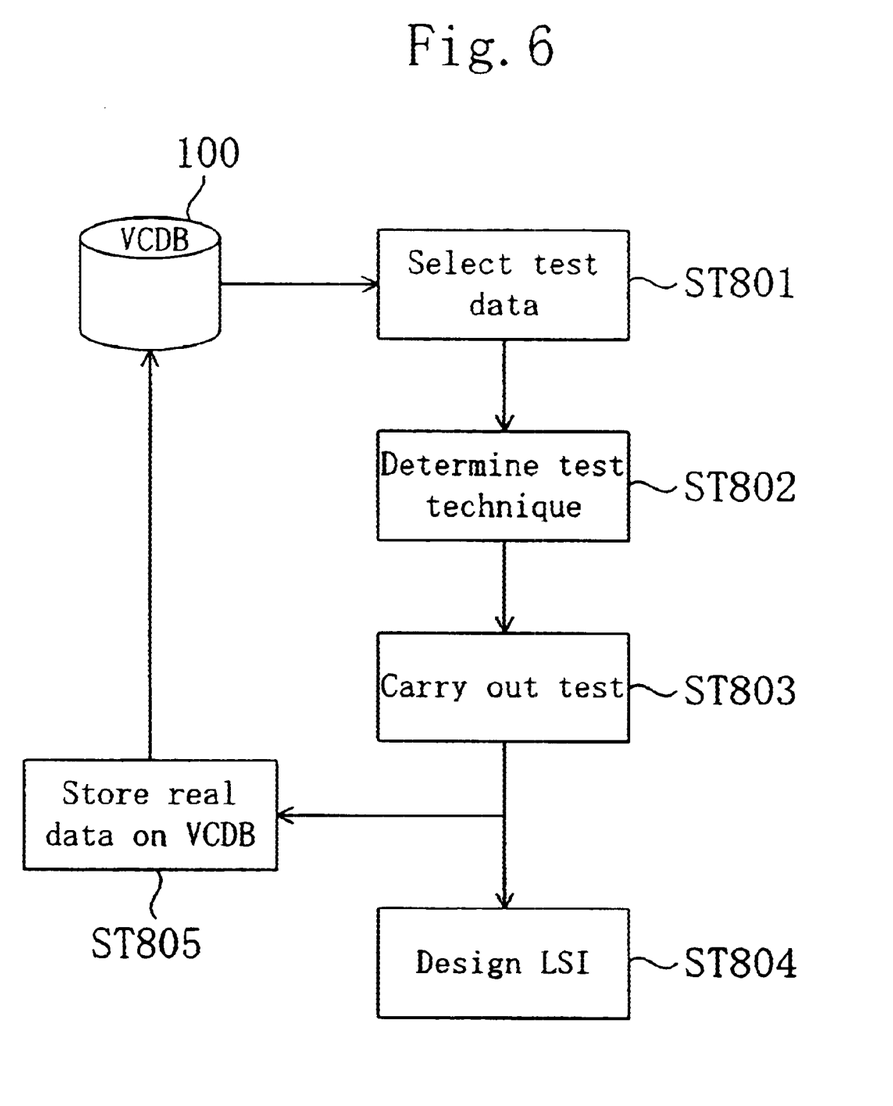
FIG. 6 is a flowchart schematically illustrating a procedure of designing an LSI by taking advantage of a learning function according to the present invention.

Next, a second specific example relating to the learning function of the VCDB during a test will be described. FIG. 6 is a flowchart schematically illustrating a procedure of designing an LSI by taking advantage of the learning function.

First, in Step ST801, test data is extracted from the VCDB 100 and data actually used for the test is selected therefrom. In this case, an estimate is used as the area of a VC, for example, when the test is carried out for the first time. Next, in Step ST802, a test technique is determined. Then, in Step ST803, a test design, i.e., designing a test circuit and making specific test vectors, is performed at the RT level, for example. Subsequently, the test results are reflected on the design of an LSI in Step ST804. On the other hand, as a result of the test in Step ST803, real data, which is more accurate than the data input in the first Step ST801, is obtained as for the VC area, for example.

Thus, in Step ST805, the real data is stored on the VCDB 100. In this case, the previous data may be updated or the real data may be stored somewhere else in the VCDB 100. And when a test is carried out next time, the real data is fetched in Step ST801 from the VCDB 100 and used for the test.

In this manner, the VCDB is provided with the learning function and the test accuracy improves every time the test is repeated.

SPECIFIC EXAMPLE 3

Next, a third specific example relating to a test constraint on the combination of dissimilar tests, in particular, will be described. In the following example, a "combination" refers to a combination of a test technique adopted for a VC and that adopted for another VC. First, a prohibited combination will be exemplified.

Prohibited Combinations

1. IDDQ and Delay Tests

IDDQ and delay tests should not be carried out at a time. In carrying out an IDDQ test, a test pattern is applied to a circuit under the test and then the application of the pattern (or clock pulses) is stopped at a predetermined time. Since the test pattern will not change after that, the circuit should be static. But if there is OFF leakage in the circuit, then it is determined that the circuit has a fault. On the other hand, the delay test is carried out to see if a circuit under the test is operable at a certain operating frequency (e.g., 100 MHz). Since this test becomes meaningless if the application of the test pattern is stopped, the delay test is not combinable with the IDDQ test.

2. IDDQ and DRAM Tests

IDDQ and DRAM test circuits should not be mounted (or should not be adopted as VCs) on an LSI at the same time. This is because it does not make any sense to carry out the IDDQ test on a DRAM in which leakage current always flows from its capacitor. However, this constraint may be eliminated if just small leakage current is flowing through a DRAM.

3. AT speed and Scan Isolation Tests

Figure 7A:
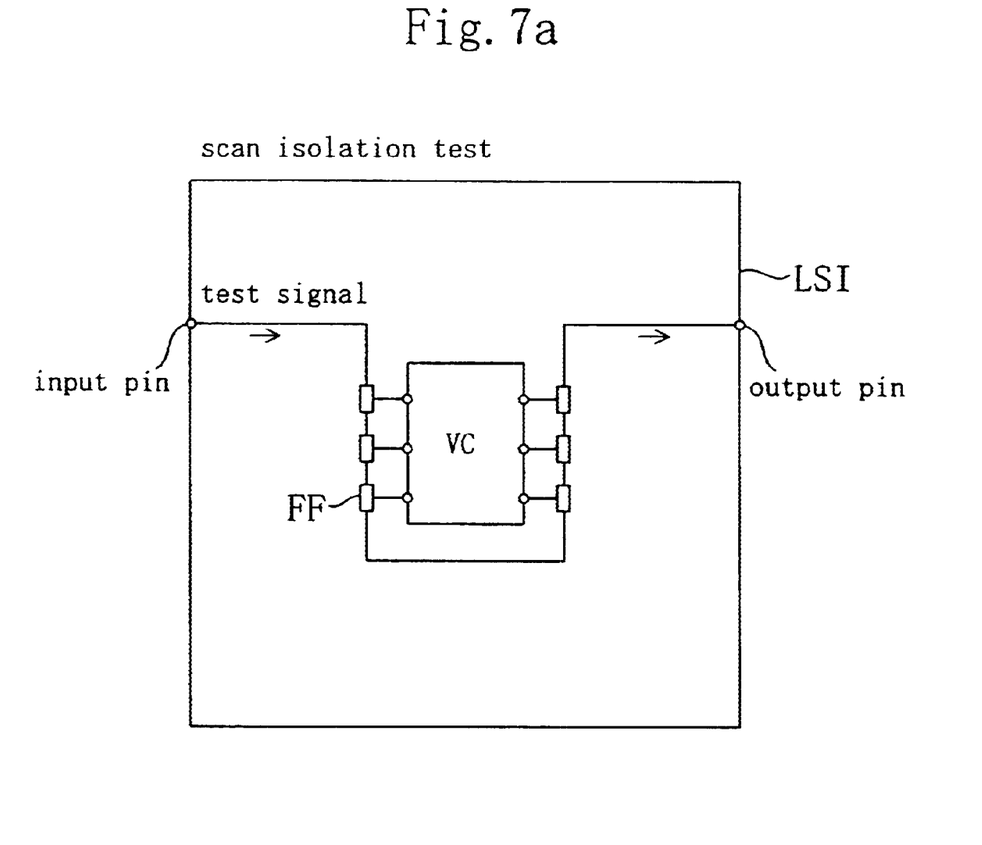
FIGS. 7(a) and 7(b) schematically illustrate scan isolation test and AT speed test methods according to the present invention.
Figure 7B:
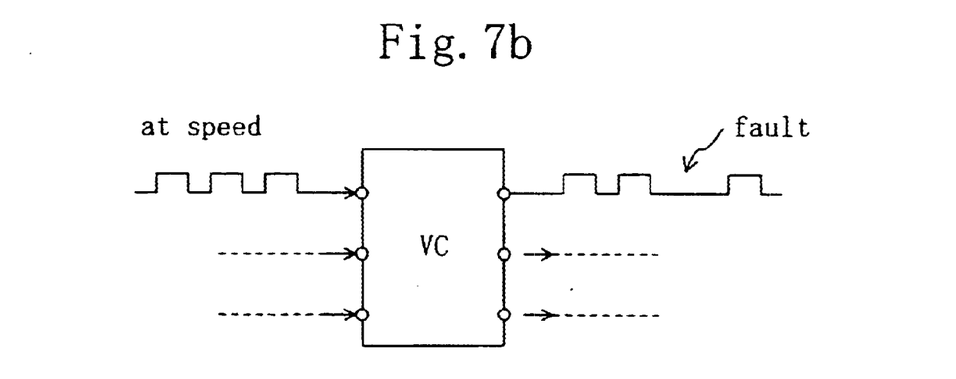

AT speed and scan isolation tests should not be carried out at the same time. FIGS. 7(*a*) and 7(*b*) schematically illustrate scan isolation test and AT speed test methods, respectively. The scan isolation test is based on the same principle as a boundary scan test. As shown in FIG. 7(*a*), a test pattern, which has been input through a common input pin of an LSI, is successively shifted in respective input terminals of a VC through a common signal line and associated flip-flops. The pattern, which has been output from respective output terminals of the VC, is output through the output pin of the LSI. And it is determined for each pair of input and output terminals whether or not the input pattern matches the associated output pattern, thereby detecting a fault in a line, for example. On the other hand, the AT speed test is carried out to check the continuity of a pattern that has been separately applied to each input terminal of a VC and then output through its associated output terminal as shown in FIG. 7(*b*). Thus, if the scan isolation test is additionally performed while the AT speed test is being carried out, then the AT speed test is disabled because the test pattern loses its continuity on the way.

4. Pin Conflict

Figure 8:
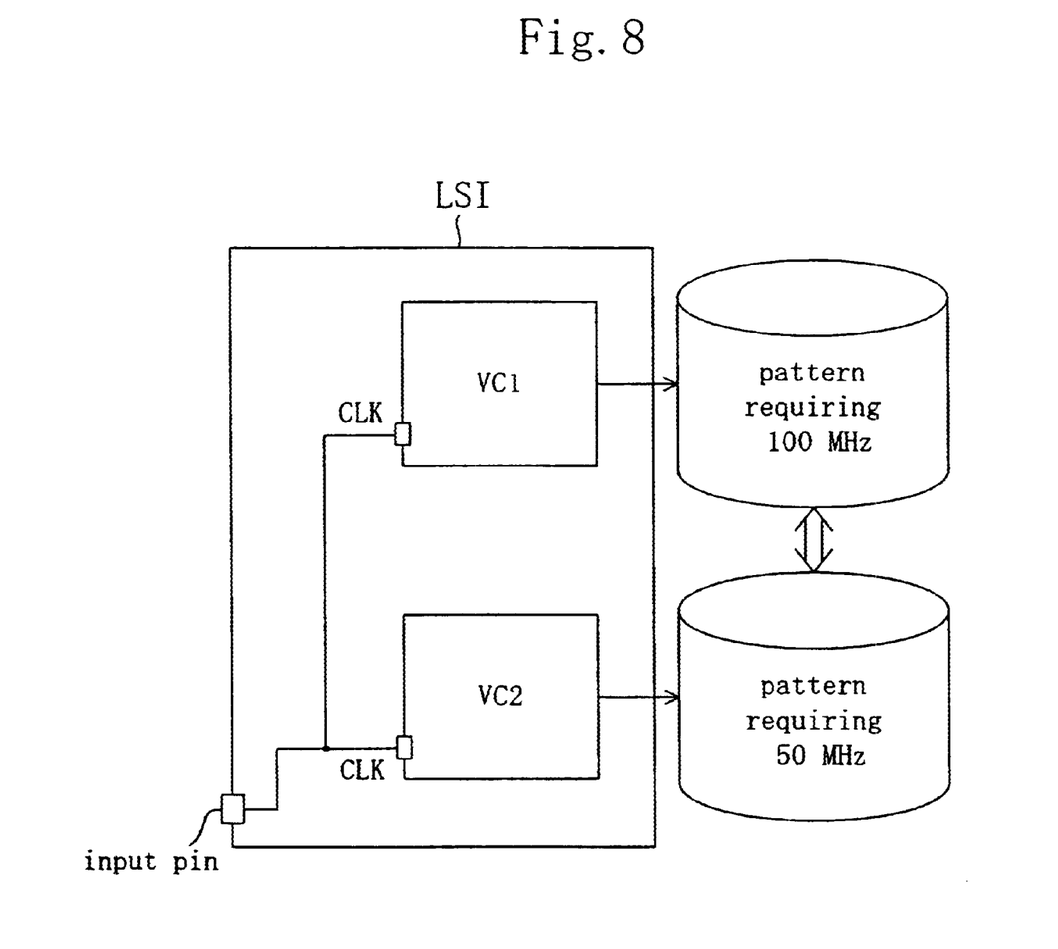
FIG. 8 is a block diagram illustrating a situation where two VCs, receiving the same clock signal through a common input pin and operating at mutually different test frequencies, are placed within a single LSI according to the present invention.

Tests on different VCs should not be carried out simultaneously if there is a pin conflict. Suppose there are two VCs VC1 and VC2, which receive the same clock signal through a common input pin, as shown in FIG. 8. A clock generator has to be controlled externally, and the VCs VC1 and VC2 should be tested using patterns requiring respective frequencies of 100 and 50 MHz. In such a situation, concurrent tests on VC1 and VC2 are prohibited because there is a pin conflict between them.

Trade-off Combinations

1. Parallel and Scan Isolation Tests

Figure 9A:
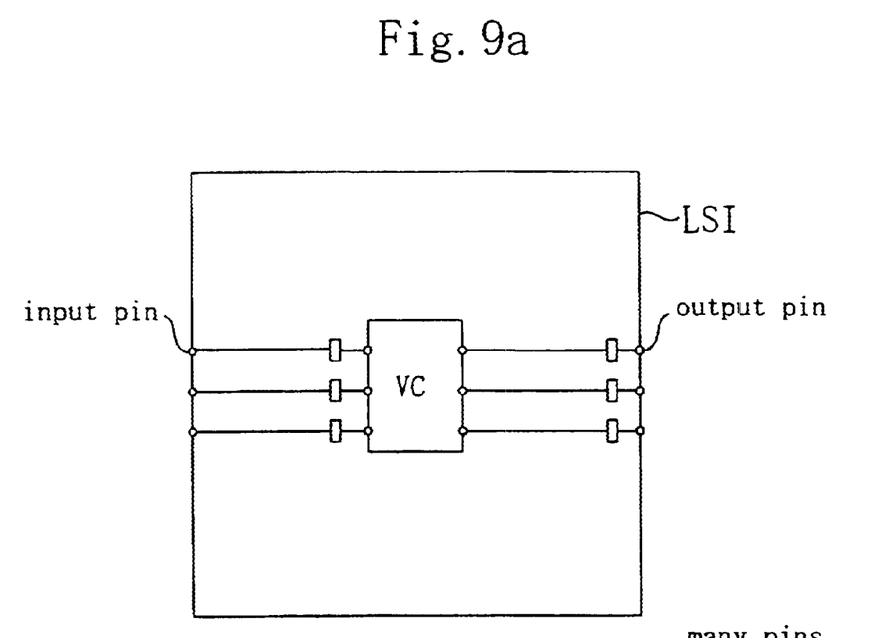
FIGS. 9(a) and 9(b) illustrate parallel and scan isolation tests according to the present invention.
Figure 9B:
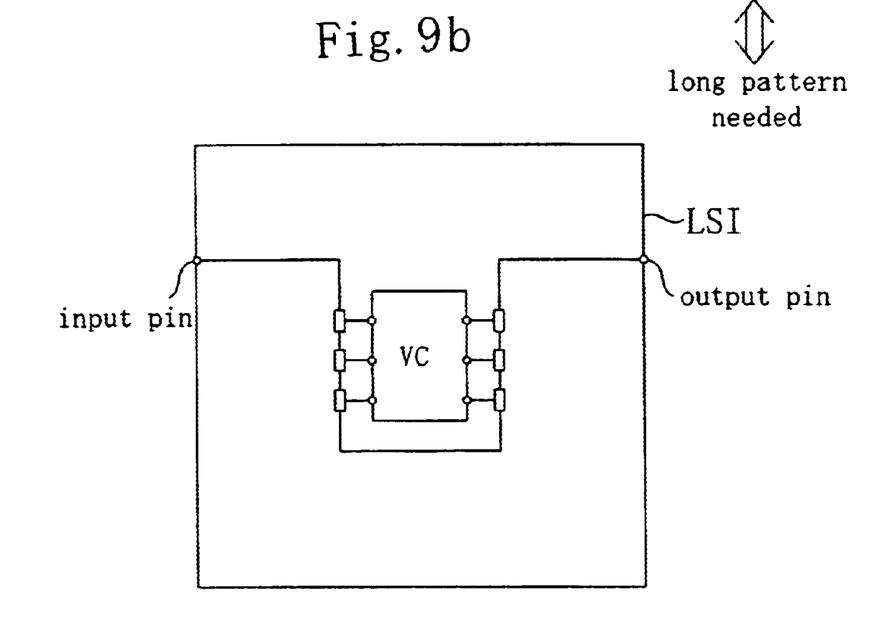

FIGS. 9(*a*) and 9(*b*) illustrate parallel and scan isolation tests. As shown in FIG. 9(*a*), a parallel isolation test is carried out by separately applying a test pattern through respective input pins of an LSI to corresponding input terminals of a VC and then comparing data patterns output through individual output pins of the LSI to the input test pattern for respective output terminals of the VC. Thus, the parallel isolation test can be performed using a common test pattern. However, according to this technique, the same number of pins as that of the terminals of the VC should be provided for testing purposes. In contrast, a scan isolation test may be carried out with a single input pin and a single output pin provided for the LSI under the test as shown in FIG. 9(*b*). However, the length of the test pattern increases with the number of flip-flops provided around the VC. Thus, a trade-off is necessary between the length of the test pattern and the number of pins.

2. Full-scan ATPG and Fault SIM Tests

A full-scan automatic pattern generation (ATPG) test is carried out using a CAD tool and providing a shift register, which includes a flip-flop and a selector, for a VC. The full-scan ATPG test is advantageous in that the test can be carried out at a fault coverage almost equal to 100% and that the number of necessary design process steps can be reduced. However, since selectors should be additionally provided, a circuit area required adversely increases. On the other hand, the fault SIM test can be performed without scanning and does not require so large an LSI. But the fault SIM test is disadvantageous in that the number of expected process steps increases. That is to say, a trade-off is also unavoidable between the full-scan ATPG and fault SIM tests.

3. Full-scan ATPG and L-BIST Tests

L-BIST is a technique for carrying out an automated test and is advantageous in that the number of pins required is small. On the other hand, although the full-scan ATPG test is advantageous in several respects described above, an external pin should be monitored and controlled externally to apply a test pattern to a VC or monitor the output thereof. Accordingly, there is a trade-off relationship between the full-scan ATPG and L-BIST tests.

4. Parallel Isolation and L-BIST Tests

As described above, according to the parallel isolation test technique, a test pattern required may be short, but the number of input or output pins of the LSI should be large. In accordance with the L-BIST test technique on the other hand, the number of pins can be smaller but a relatively long test pattern is needed. Therefore, a trade-off is inevitable between the parallel isolation and L-BIST tests.

SPECIFIC EXAMPLE 4

Next, a fourth specific example, which relates to a method of minimizing a test time by selecting a best combination of VCs, will be described.

Figure 10A:
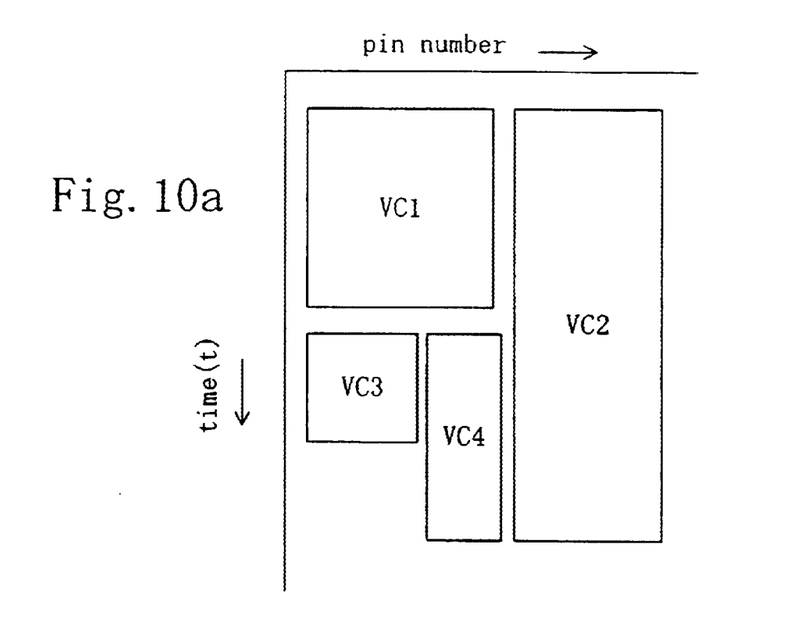
FIGS. 10(a) and 10(b) illustrate VC test patterns each represented as a coordinate system in which pins used are indexed by numbers with respect to time before and after an inventive test time minimizing process is performed.
Figure 10B:
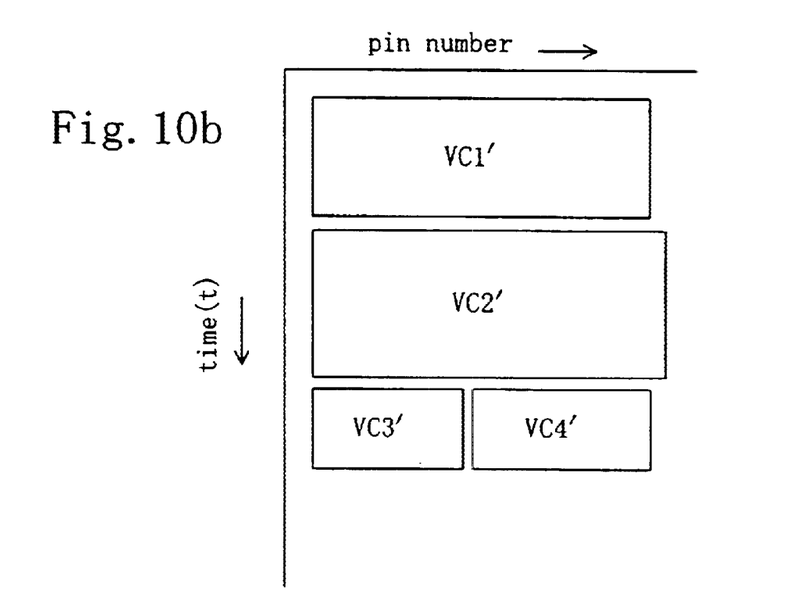

FIGS. 10(a) and 10(b) illustrate VC test patterns each represented as a coordinate system in which pins used are indexed by numbers with respect to time before and after an inventive test time minimizing process is performed. Suppose it was found by a test pattern that a test time is long if VCs VC1, VC2, VC3 and VC4 shown in FIG. 10(a) are selected from the VCDB 100. In this test pattern, test time and number of pins are variable depending on the test techniques allocated. As described above, multiple VCs associated with the same function and mutually different test techniques (i.e., test patterns in this case) are stored on the VCDB 100. Thus, other substitute VCs, each of which has the same function as, but a different test pattern from, the counterpart VC1, VC2, VC3 or VC4, are picked from the VCDB 100, and the respective test times are calculated. In this manner, a best combination of VCs that will minimize the total test time, VC1', VC2', VC3' and VC4', are selected.

Accordingly, this is an even more favorable technique of minimizing both the total test cost and total test time alike.

In the foregoing embodiment, the present invention has been described as being applied to a test that is carried out to detect faults. However, the present invention is in no way limited to such a specific embodiment, but is applicable to a test of any other type such as a performance test.

What is claimed is:

1. A database for designing an integrated circuit device, the database comprising multiple cores, each of said cores storing therein data representing functional specifications utilized in designing the device, and a test technique,
    wherein the data corresponding to the functional specification of each of the cores represents the same function, and each core has a mutually distinct test technique.

2. A database for designing an integrated circuit device, the database comprising multiple cores for storing therein data representing functional specifications utilized in designing the device, and a test technique for testing said core, p1 wherein at least one test technique is stored for each said core.

3. The database of claim 2, wherein information about a test cost, which is required by the at least one test technique for each said core, is stored.

4. The database of claim 3, wherein the information about the test cost is at least one item selected from the group consisting of: how many pins should be controlled and monitored externally when the core is tested; how long a test pattern is; how much the integrated circuit device increases its area when a test circuit is added; fault coverage; test time; number of design process steps; and yield of the device.

5. A database for designing an integrated circuit device, the database comprising at least one core for storing therein data representing a functional specification utilized in designing the device,
    wherein information about a test constraint is stored, said test constraint defining at least one requirement for testing the at least one core.

6. The database of claim 5, wherein the information about the test constraint is at least one item selected from the group consisting of: in what state a pin should be to control the core in a test mode or to keep the core safe and non-broken; whether the core should be dynamic or static; whether or not a test pattern may be divided; and where the test pattern should be divided.

7. A method for designing an integrated circuit device by using a core database, the core database comprising multiple cores for storing therein data needed in designing the device, a plurality of test techniques being stored for the respective cores, the method comprising the steps of:
    a) selecting candidate cores and test techniques for use in testing the device from the database;
    b) estimating a total cost when each said core and associated test technique is selected; and
    c) selecting one of the candidate cores and associated one of the test techniques that will minimize the test cost.

8. The method of claim 7, wherein the estimated test costs are presented in the step b).

9. The method of claim 7, wherein in the step b), it is determined whether or not each said test technique picked meets a constraint on the number of pins available for testing, and the test costs are estimated for only the test techniques meeting the constraint.

10. The method of claim 9, wherein in the step b), if one of the test techniques picked fails to comply with the constraint, an error is indicated.

11. The method of claim 7, wherein in the step b), a test pattern for each said core picked is divided with respect to time so as to meet a constraint on the number of pins available for testing, the test pattern is modified to minimize a test time and then the test cost is estimated.

12. The method of claim 7, wherein in the step b), the test cost is estimated by weighting priority orders in terms of a parameter affecting the test cost.

13. A method for designing an integrated circuit device by using a core database, the core database comprising multiple cores for storing therein data needed in designing the device, the cores being associated with the same function and mutually different test techniques, the method comprising the steps of:
    a) selecting a candidate core and associated test technique for use in testing the device from the database;
    b) estimating how much a test cost when the core and test technique selected would be when a constraint is met;
    c) replacing the core selected with another core that corresponds to the same function as, and a different test technique from, the candidate core; and
    d) selecting one of the cores and an associated test technique thereof as those minimizing the test cost by repeatedly performing the step c).

14. The method of claim 13, wherein in the step d), the core and the associated test technique thereof are selected so as to minimize a test time while meeting a constraint on available pins when the test technique is represented as a test pattern in a coordinate system in which pins used are indexed by numbers with respect to time.

15. The method of claim 7, wherein in the step b), weightings are assigned, according to users, to elements constituting to each test cost when estimating the total test cost.

16. The method of claim 13, wherein in the step b), weightings are assigned, according to users, to elements constituting to each test cost when estimating the total cost.

* * * * *